United States Patent [19]

Stein

[11] 4,345,318
[45] Aug. 17, 1982

[54] HIGH PERFORMANCE MONOLITHIC DIGIT DRIVER

[75] Inventor: Morris O. Stein, Wayne, N.J.

[73] Assignee: The Singer Company, Little Falls, N.J.

[21] Appl. No.: 182,385

[22] Filed: Aug. 29, 1980

[51] Int. Cl.³ .............................................. G11C 7/00
[52] U.S. Cl. ..................................... 365/196; 365/69; 365/209
[58] Field of Search ................... 365/69, 195, 196, 209

[56] References Cited

U.S. PATENT DOCUMENTS 3,409,883 11/1968 Norton ................................ 365/196

*Primary Examiner*—James W. Moffitt
*Attorney, Agent, or Firm*—Morris Liss; Thomas W. Kennedy

[57] ABSTRACT

An impedance is connected by a switching circuit, to sense/inhibit windings of a core memory at the end of each memory cycle. The result is an effectively decreased time constant for the core windings which permits faster memory operation. The circuit further reverse biases diodes connected to the input terminals of a sense amplifier during a read cycle thereby increasing the isolation of this amplifier from the effects of inhibit current pulses occurring during a memory read cycle.

7 Claims, 9 Drawing Figures

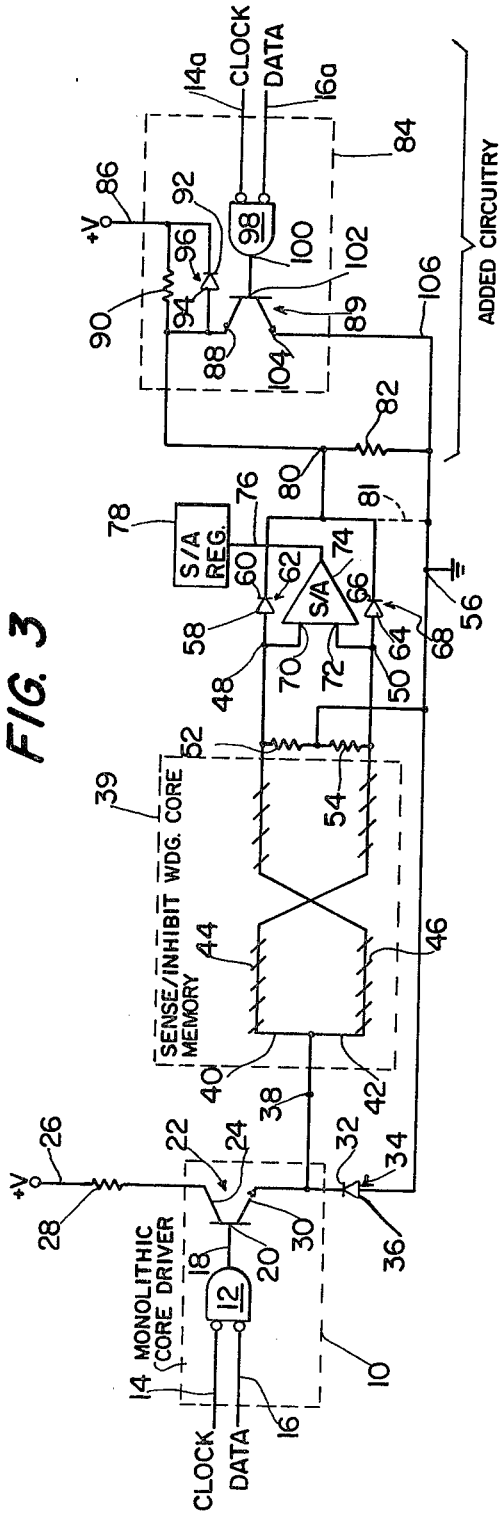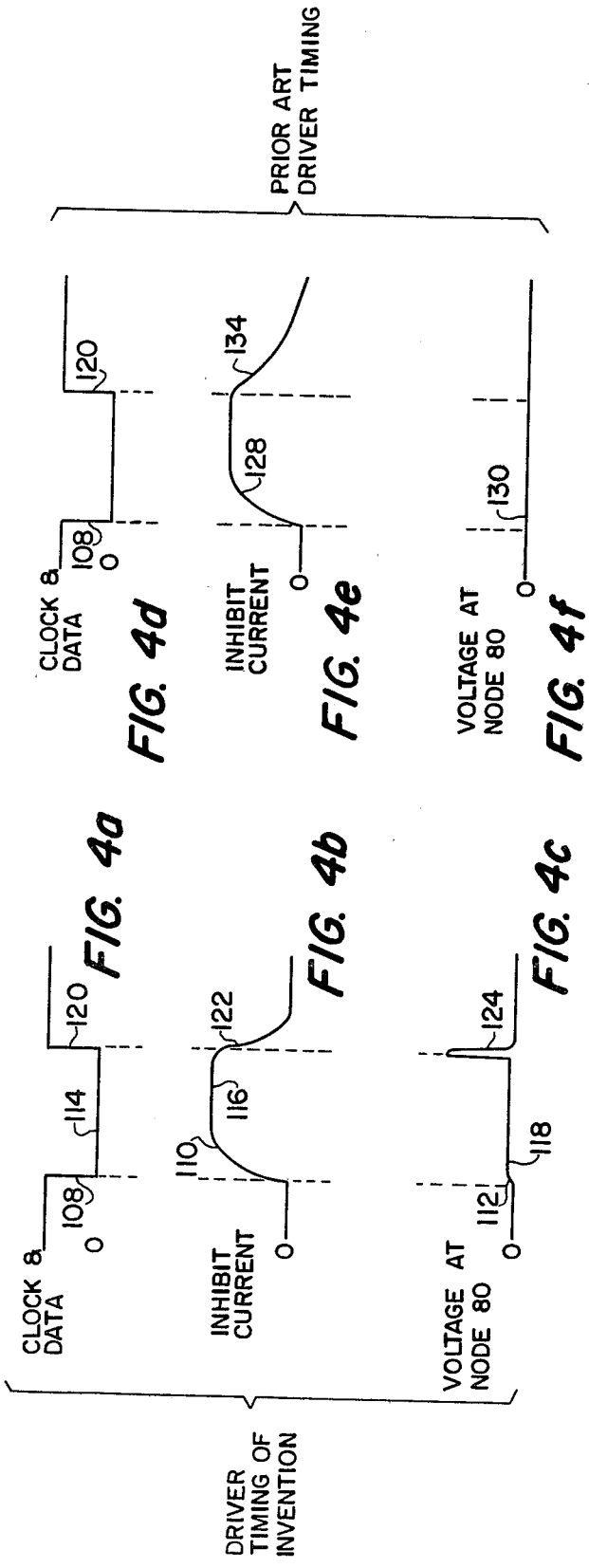

HIGH PERFORMANCE MONOLITHIC DIGIT DRIVER

FIELD OF THE INVENTION

The present invention relates to core memories, and more particularly to digit driver circuits for sense/inhibit windings of a core memory.

BACKGROUND OF THE INVENTION

FIG. 1 shows a typical eight-by-eight core array. The X-axis drive wire carries a half-select "read" or "write" current pulse equivalent to one-half the current required to switch a core. The Y-axis drive wire also carries a half-select "read" or "write" current pulse. Either half-select pulse is insufficient to switch a core. The sense/inhibit wire carries a half-select current pulse during the "write" operation, and also carries the sense voltage during the "read" operation.

During the "write" operation, when a ONE is to be written, half-select current pulses are driven along the X and Y wires and add at the selected address to change the flux state of the core. When a core is to be left in the ZERO state, X and Y lines again receive half-select current pulses, but at the same time a half-select current pulse is driven along the sense/inhibit wire. The direction of this pulse opposes and therefore cancels the X pulse. The net result is one half-select pulse which is insufficient to switch the core; as a result, the core remains in a ZERO state.

During the "read" operation, X and Y half-select current pulses are again applied, but in the opposite direction. These current pulses add at the core location to switch the core. The sense/inhibit wire functions during this portion of the cycle to carry the sense voltage to the differential sense amplifier.

The technique of using one wire for both the sense and inhibit functions involves splitting the sense/inhibit winding into two wires or legs (FIG. 2), and driving the inhibit current into each leg. Only one inhibit-driver circuit, hereinafter referred to as a "digit driver" is required for the two legs. The bisecting of the wire results in a shorter period of time required for transient decay.

In addition, the use of a differential sense amplifier for detection of the signal provides a means of eliminating noise transients. This amplifier has a high common-mode rejection that combines and rejects the major part of the common mode noise. The circuit and memory operation just described is disclosed in the publication "Computer Design", July, 1968, page 50.

Multiple digit drivers are presently used in conventional coincident current core memories for producing a relatively large amplitude current pulse with controlled transient and steady state characteristics. These drivers control the data content to be written into core memory and to a large extent influence memory speed and performance.

Digit driver electrical characteristics are very critical, especially during turn-off in three-wire-3D coincident current core memory systems where a single winding is shared for both the sense and inhibit functions for each digit of the memory word. A subsequent memory read cycle cannot be successfully performed until the common sense/digit lines have fully recovered from the efforts of the previous large amplitude digit current pulses. During the memory read cycle, a relatively small core switching voltage appears across the common sense/digit lines for each digit of the memory word which is sensed and interrogated by corresponding sense amplifiers to determine data content.

BRIEF DESCRIPTION OF THE PRIOR ART

In recent years, digit drivers have been fabricated as monolithic integrated circuits such as the type marketed by Texas Instruments, Incorporated and designated by model number SN55325. In order to achieve both fast transient turn-on an turn-off times with monolithic digit drivers, either pulse transformers or level shifters were employed primarily to reduce the turn-off recovery time.

Sense amplifier isolation was achieved by utilizing additional components in series with the current termination diodes or using an additional power supply voltage.

In low performance memory systems, the digit current was allowed to decay slowly, thereby increasing the memory cycle time and reducing memory speed.

Transformers are bulky, require additional components and inherently require additional recovery time. Level shifters require additional recovery time. Level shifters require extra components. Both tansformers and level shifters are more costly.

Disadvantages of prior art sense amplifier isolation techniques include additional power dissipated during the time digit current is flowing and the cost of additional components and/or a power supply.

The above-mentioned objects and advantages of the present invention will be more clearly understood when considered in conjunction with the accompanying drawings, in which:

BRIEF DESCRIPTION OF THE FIGURES

FIG. 3 is an electrical schematic diagram of the present invention illustrating a swtiching circuit for connecting an impedance into circuit with the core windings to decrease the time constant.

FIGS. 4a–4c are timing diagrams of signals at critical points of the inventive digit driver circuit.

FIGS. 4d—4f are timing diagrams of signals at critical points of a prior art digit driver circuit.

BRIEF DESCRIPTION OF THE PRESENT INVENTION

The primary purpose of the present invention is to improve and simplify the digit driver circuits which drive the common sense digit windings within a core memory.

A secondary purpose of the invention is to provide greater sense amplifier isolation from the effects of inhibit current during memory read cycle time.

The present invention is particularly suited for improving the performance of conventional monolithic digit driver circuits by adding a switching circuit that increases resistance in the sense/inhibit winding of a core memory at the end of a memory cycle which results in a decrease of the time constant in the sense/inhibit winding and permits faster operation of a memory. The switching circuit itself may be constructed from components on the very same monolithic chip which includes the core driver which drives the sense/inhibit winding. The result is an improved inhibit current driver for a core memory.

The same switching circuit which decreases the time constant also controls diodes connected to the input terminals of a sense amplifier. Utilization of a switching circuit on the same component as the core driver provides an economical means for providing greater sense amplifier isolation by reverse biasing the diodes during the memory read cycle time, when the digit driver is in its off state.

DETAILED DESCRIPTION

Figure 1:
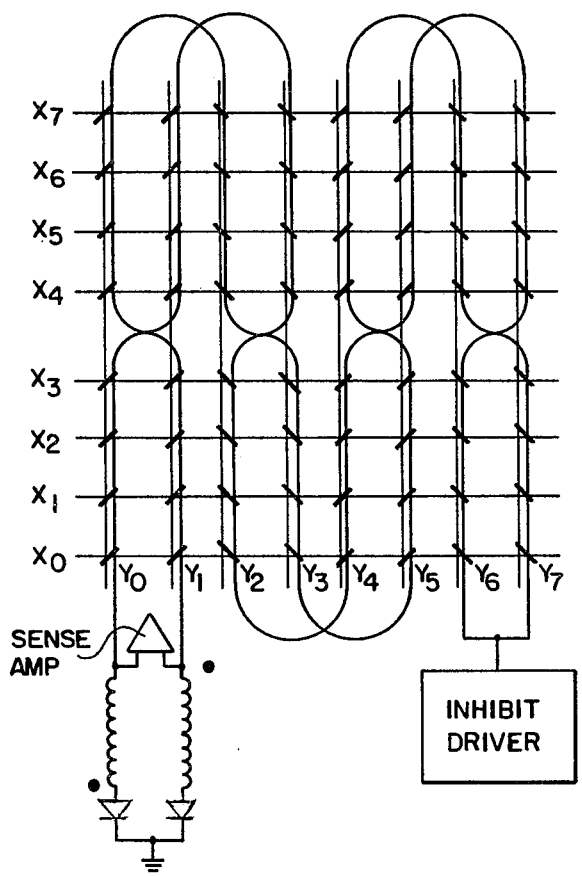
FIG. 1 is an electrical schematic diagram of a prior art core array with inhibit driver and sense amplifier components.
Figure 2:
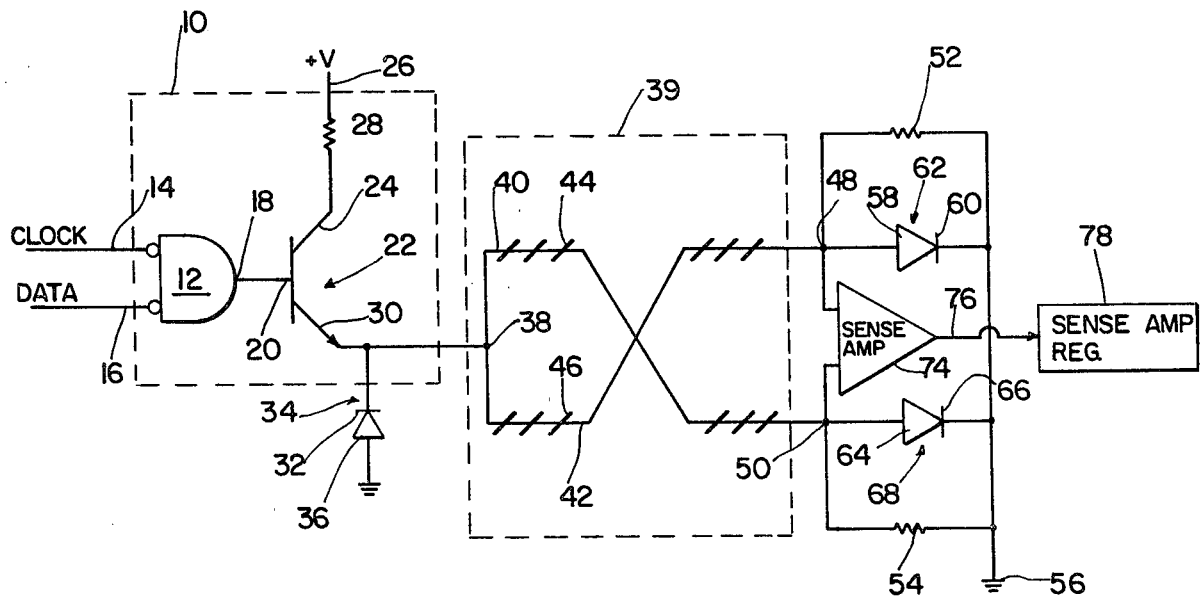
FIG. 2 is an electrical schematic diagram illustrating a prior art monolithic digit driver connected to sense/inhibit windings of a core memory.

FIG. 2 illustrates the most relevant prior art for which the present invention, explained hereinafter, is an improvement. A monolithic digit driver has as its front end a conventional monolithic core driver circuit, generally indicated by reference numerral 10. This may, for example, be fabricated from the industrial standard monolithic driver identified in the trade as a model 55325 driver. Typically, a monolithic device of the type identified includes four such drivers. The driver 10 includes a NAND gate 12 having a clock input 14 and a data input 16. Bearing in mind that the circuitry operates the sense/inhibit winding of a memory during the inhibit mode, gate 12 is enabled when the signal on clock input 14 and data input 16 are in logic load states. The output 18 of gate 12 is connected to the base 20 of an NPN transistor 22. The collector 24 of transistor 22 is connected to a DC potential 26 through a current setting resistor 28. The emitter 30 of transistor 22 forms the output of the driver 10. When gate 12 is enabled, transistor 22 is turned on and saturates. This causes digit current to flow through the sense/digit windings of the core memory 39. A parallel connection path to the transistor emitter 30 includes cathode 32 and anode 36 of the clamping diode 34.

Current from the emitter 30 of transistor 22 flows into node 38 where the current divides equally through each half winding 40, 42 of the sense/digit winding. In a typical core memory of the type described, there are 8,192 cores/half windings such as indicated by reference numerals 44 and 46.

Input terminals 48 and 50 of sense amplifier 74 are connected to respective half windings 42 and 40, as inputs thereto. Termination resistors 52, 54 serve to attenuate signals which might be reflected back to the cores thereby adversely affecting the operation of the memory. Current flowing through the half windings 42 and 40 is directed to ground 56 through the termination resistors 52, 54. Anode 58 of diode 62 is connected to input terminal 48 while the cathode 60 of diode 62 is connected to ground 56. Similarly, anode 64 of diode 68 is connected to input terminal 50 while the cathode 66 of the diode 68 is connected to ground 56. Diodes 62 and 68 clamp input terminals 48, 50 to ground. The sense amplifier 74 is typified as a differential amplifier which senses when the amplitude of an input signal exceeds a threshold level. This amplifier may be of a conventional type identified by the industrial model number 55236, conventionally fabricated in monolithic form and available from Texas Instruments, Incorporated. The output 76 from the sense amplifier loads a sense amplifier register 78 which stores the output from sense amplifier 74.

The digit current rise time is predominantly determined by the L/R ratio of the described circuit. The maximum steady state current is determined by the DC potential at 26 and the circuit voltage drop with respect to the total circuit resistance.

During the digit current transient turn-off time, it is necessary to clamp a negative voltage spike at node 38, which is caused by the interruption of current flow through the predominantly inductive half windings 40, 42. The negative voltage spike would otherwise forward bias the monolithic driver substrate and render it ineffective or destroyed. Diode 34 is utilized for clamping the node 38 to ground, in the event of such a negative voltage spike, thus preventing this problem from occurring.

Although the use of clamping diode 34 eliminates one problem, its addition causes a substantial increase in the digit current fall time thereby reducing the memory timing margins of the circuit. With the present invention, fast turn-off is achieved when a controlled impedance is added to the discharge path, providing protection against forward biasing of the substrate of monolithic driver 10.

FIG. 3 includes the prior art circuitry of FIG. 2 and additional circuitry connected to the node 80 which improves the prior art circuitry. Common numerals are employed in FIGS. 2 and 3. As will be noted from FIG. 3, the circuit path 81 is removed so that clamping diodes 62 and 68 are no longer directly connected to ground 56. Rather, the ground path is established from node 80 to ground 56, via resistor 82. The means for switching in resistor 82 at the end of a memory cycle to decrease the time content of the circuitry will now be explained.

Reference numeral 84 generally indicates a switching circuit driven at inputs 14a and 16a by the same signals appearing at 14 and 16 at driver 10, which may be fabricated from the components of a second core driver, similar to the first mentioned driver 10 and conveniently existing on the same substrate therewith. A DC potential is provided at 86 to the collector 88 of an NPN transistor 89. The collector circuitt of transistor 89 includes a resistor 90 connected in parallel with diode 96, the cathode 92 of the diode connected to the DC potential 86, while the anode 94 is directly connected to the collector 88. As in the case of driver 10, when logic level inputs occur at inputs 14a and 16a, gate 98 is enabled and the gate output 100, connected to base 102 of transistor 89 causes the transistor to turn on. The emitter 104 of transistor 89 is directly connected, via lead 106, to ground 56. Resistor 90 provides a bias for diodes 62 and 68 in the reverse direction when the core is being read. Otherwise, the core output will be susceptible to erroneous output noise signals. If the switching circuit 84 is constructed from a driver section of a monolithic substrate as previously identified, the resistor 90 and diode 96 will be internally available components.

FIGS. 4a–4c illustrate the timing diagrams incident to the inventive circuit of FIG. 3. In FIG. 4a, both clock and data signals are seen to include a pulse having the change of state at edge 108. The plot of inhibit current at node 38 is shown in FIG. 4b. It will be seen that the pulse of the inhibit current has a rise time indicated by reference numeral 110 after which the pulse flattens at 116 during the pulse width (114) of the clock and data signals (FIG. 4a). At trailing edge 120 of the clock and data signals (FIG. 4a), transistor 22 opens and the fall time for the inhibit current is shown in FIG. 4b, at 122. FIG. 4c illustrates the signal at node 80. At the beginning of the clock and data pulses (FIG. 4a), the signal at node 80 remains virtually shorted (112, 118) because of the conduction through transistor 89 in switching circuit 844. At trailing edge 120 of the clock and data pulses (FIG. 4a), transistor 89 opens and a pulse indicated at 124 of FIG. 4c results. The pulse is caused by core dissipation energy flowing through resistor 82, diodes 62, 68 and diode 34. The timing diagrams relating to the driver of the present invention should be compared with the timing diagrams of the prior art driver of FIG. 2. The plot of FIG. 4d shows the clock and data signals occurring at the input of the prior art driver, the signals being identical to those shown in FIG. 4a. The inhibit current at node 38 of the prior art driver (FIG. 2) seen in timing diagram FIG. 4e shows a rise time at 128, comparable to that of 110 in FIG. 4b. However, the fall time at the end of a memory cycle, shown at 134, is seen to be substantially greater than that for the present invention (FIG. 4b). As previously mentioned, this is due to the longer time constant of the prior art driver which poses a speed problem for a memory. In FIG. 4f, the voltage at node 80 is seen to be mentioned at ground level 130 due to the direct connection of this node to ground 56, only in the prior art structure of FIG. 2.

From a review of the timing diagrams incident to the prior art as compared with that of the present invention, it will be appreciated that resistor 82 achieves a fast turn-off time constant and limits the voltage at the input to the sense amplifier during a memory inhibit cycle. The inclusion of resistor 82 also provides a reverse bias for diodes 62 and 68 during a memory read cycle when the digit current is off and resistor 82 forms a voltage divider with resistor 90 of switching circuit 84.

The discharge current path during digit current turn-off transients includes the core memory half windings 40, 42, resistors 52, 54, diode 34, diodes 62 and 68 and return to the half windings.

The proposed inventive circuitry could be applied to any monolithic driver which drives an inductive load where transient response is critical. Timing between gates 12 and 98 (FIG. 3), respectively, could be somewhat time skewed to optimize propagation delay parameters within the monolithic driver and to shape the digit current pulse during its transitions.

In summary, the added circuitry shown in FIG. 3 provides a fast transient digit current turn-off time, while protecting the driver 10 from a potentially damaging negative voltage spike. Further, the circuitry allows the core memory to be operated at high speeds and to achieve greater operational performance with a minimum of additional components. In addition, diodes 62 and 68 are reverse biased during the read cycle, without dissipating additional power during the digit current pulse time.

Thus, an economical means for providing fast turn-off characteristics to a monolithic digit driver is achieved without allowing the monolithic substrate to become forward biased thereby damaging the device. In addition, an economical means for providing greater sense amplifier isolation is achieved by reverse biasing diodes 62 annd 68 during the memory read cycle time period when the digit driver is in its off state.

It should be understood that the invention is not limited to the exact details of construction shown and described herein for obvious modifications will occur to persons skilled in the art.

I claim:

1. In an inhibit current driving circuit for a core memory including two half windings for inhibiting each digit of a memory word, the windings connected to inputs of a sense amplifier, and diodes connected between respective amplifier inputs and a node, the improvement comprising:
   resistance means connected between the node and ground; and
   switching means having its output connected across the resistance means for controllably introducing the resistance means in circuit between the node and ground, only at the end of an inhibit cycle thus decreasing the time constant of the circuit and providing fast transient inhibit signal turn off therein.

2. The circuit of claim 1 wherein the current driving circuit further comprises:
   first gating means having a data signal and a timing signal at the inputs thereof;
   first transistor means having its input connected to an output of the first gating means; and
   means connecting inhibit current through the first transistor to the node upon coincidence of signals at the first gating means;
   wherein the switching means comprises:
   second gating means having the data and timing signals at the input thereof;
   second transistor means having an input thereof connected to an output of the second gating means; and
   means connecting output terminals of the second transistor means across the resistance means.

3. The subject matter set forth in claim 2 wherein both gating means and both transistors are contained on a monolithic device having a single substrate.

4. A monolithic inhibit current core driving circuit for a core memory including two half windings for inhibiting each digit of the memory, the circuit comprising:
   first gating means having a data signal and a timing signal at the inputs thereof;
   first transistor means having its input connected to an output of the first gating means;
   a first node existing between a preselected output terminal of the first transistor means and the half windings;
   means connecting inhibit current through the first transistor to the node upon coincidence of signals at the first gating means;
   termination means connected to the half windings for suppressing signal reflection across the windings;
   sense amplifier means having inputs connected to the windings for sensing core state during a memory read cycle;
   diodes connected between a corresponding sense amplifier input and a common second node;
   a resistor connected between the second node and ground; and
   switching means having its input connected across the resistor for controllably placing the resistor in circuit between the second node and ground, only at the end of an inhibit cycle, thus decreasing the time constant of the circuit and providing fast transient inhibit signal turn off therein.

5. The subject matter set forth in claim 4 wherein the switching means comprises second gating means having the data and timing signals at the input thereof;
   second transistor means having an input thereof connected to an output of the second gating means; and means connecting output terminals of the second transistor means across the resistance means.

6. The subject matter set forth in claim 5 wherein both gating means and boh transistors are contained on a monolithic device having a single substrate.

7. The subject matter set forth in claim 6 wherein the voltage across the resistor during a memory read cycle reverse biases the diodes connected between the sense amplifier input and the common second node thereby enhancing isolation of the same amplifier input during the memory read cycle.

* * * * *